(12) United States Patent
Dirk et al.

(10) Patent No.: US 8,427,809 B1
(45) Date of Patent: Apr. 23, 2013

(54) THERMALLY SWITCHABLE DIELECTRICS

(75) Inventors: Shawn M. Dirk, Albuquerque, NM (US); Ross S. Johnson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 211 days.

(21) Appl. No.: 13/034,535

(22) Filed: Feb. 24, 2011

Related U.S. Application Data

(60) Provisional application No. 61/311,890, filed on Mar. 9, 2010.

(51) Int. Cl.
*H01G 7/00* (2006.01)
*H01R 4/24* (2006.01)
*H01R 4/26* (2006.01)
*H01R 11/20* (2006.01)
*H01R 33/02* (2006.01)
*H01R 33/08* (2006.01)

(52) U.S. Cl.
USPC .............................. 361/282; 439/393; 439/239

(58) Field of Classification Search .................. 361/282; 439/393, 239
See application file for complete search history.

(56) References Cited

U.S. PATENT DOCUMENTS 5,473,047 A * 12/1995 Shi ................................ 528/310

OTHER PUBLICATIONS

Jung-Il Jin, Chi-Kyun Park, Hong-Ku Shim, Synthesis and Electrical Conductivities of Poly(2,3,5,6-tetramettroxy-1,4-phenylenevinylene) and a Series of Poly(1,4-phenylenevinylene-co-2,3,5,6-tetramethoxy-1,4-phenylenevinylene)s, Macromolecules, vol. 26, No. 8, Apr. 12, 1993, pp. 1799-1804.
Chen Li, Miaoyin Liu, Neil G. Pschirer, Martin Baumgarten, Klaus Mullen, Polyphenylene-Based Materials for Organic Photovoltaics, Chem. Rev. 2010, 110, pp. 6817-6855.
Jiongxin Lu, Kyoung-Sik Moon, Jianwen Xu, C.P. Wong, Synthesis and dielectric properties of novel high-K polymer composites containing in-situ formed silver nanopartides for embedded capacitor applications, Journal of Materials Chemistry, 2006, pp. 1543-1548.
T. Ohnishi, T. Noguchi, T. Nakano, M. Hirooka, I. Murase, Preparation and Properties of Highly Conducting Poly(Arylene Vinylenes), Synthetic Metals, 41-43, 1991, pp. 309-312.
Bing R. Hsieh, Synthesis of Highly Phenylated Poly(p-phenylenevinylenes) via a Chlorine Precursor Route, Macromolecules, 1998, vol. 31, No. 3, pp. 631-636.
M. Ahlskog, Doping and Conductivity Studies on Poly(p-phenylene vinylene), Synthetic Metals 89 (1997), pp. 11-15.
Yen-Ju Cheng, Synthesis of Conjugated Polymers for Organic Solar Cell Applications, Chemical Reviews, 2009, vol. 109, No. 11, pp. 5868-5923.
Layl-Lay Chua, General Observation of N-Type Field-Effect Behaviour in Organic Semiconductors, Letters to Nature. Mar. 2009, vol. 434, pp. 194-199.

(Continued)

*Primary Examiner* — Eric Thomas
*Assistant Examiner* — Arun Ramaswamy
(74) *Attorney, Agent, or Firm* — Kevin W. Bieg

(57) ABSTRACT

Precursor polymers to conjugated polymers, such as poly (phenylene vinylene), poly(poly(thiophene vinylene), poly (aniline vinylene), and poly(pyrrole vinylene), can be used as thermally switchable capacitor dielectrics that fail at a specific temperature due to the non-conjugated precursor polymer irreversibly switching from an insulator to the conjugated polymer, which serves as a bleed resistor. The precursor polymer is a good dielectric until it reaches a specific temperature determined by the stability of the leaving groups. Conjugation of the polymer backbone at high temperature effectively disables the capacitor, providing a 'built-in' safety mechanism for electronic devices.

15 Claims, 11 Drawing Sheets

OTHER PUBLICATIONS

M. Esteghamatian, Effect of Lithium Doping on the Conductivity of poty(p-phenylene vinylene), Synthetic Metals, 63 (1994), pp. 195-197.
R.H. Friend, Electroluminescence in Conjugated polymers, Review Article, Nature, Jan. 14, 1999, vol. 397, pp. 121-128.
Andrew C. Grimsdale, Synthesis of Light-Emitting Conjugated Polymers for Applications in Electroluminescent Devices, Chemical Reviews, 2009 vol. 109, No. 3, pp. 897-1091.
Bernd A. Hess, AB Initio MRD CI Potential Curves, Dipole Moments and Zero-Field Splittings for the X 2II Ground States of the CF and CCl Molecules, Chemical Physics 101 (1986), pp. 211-216, Amsterdam.
G. Hougham, Synthesis nd Properties of Highly Fluorinated Polyimides, Macromolecules, 1994, vol. 27, No. 13, pp. 3642-3649.
G. Hougham, Polarization Effects of Fluorine on the Relative Permittivity in Polyimides, Macromolecules, 1994, vol. 27, No. 21, pp. 5964-5971.
Bing R. Hsieh, Chlorine Precursor Route (CPR) Chemistry to Poly(p-phenylene vinylene)-Based Light Emitting Diodes, Advanced Materials Communications, 1995, 7, No. 1, pp. 36-38.
Bing R. Hsieh, A New Family of Highly Emissive Soluble Poly(p-phenylene vinylene) Derivatives. A Step toward Fully Conjugated Blue-Emitting Poly(p-phenylene vinylenes).
Wai Chou Wan, Halogen Precursor Route to Poly[(2,3-diphenyl-p-phenylene)vinylene] (DP-PPV): Synthesis, Photoluminescence, Electroluminescence, and Photoconductivity, Macromolecules 1997, vol. 30, No. 21, pp. 6567-6574.
Han Vinh Huynh, Anagostic Interactions and Catalytic Activities of Sterically Bulky Benzannulated N-Heterocyclic Carbene Complexes of Nickel(II), Organometallics 2008, vol. 27, No. 10, pp. 2231-2237.
T. Ichino, Synthesis and Properties of New Polyimides Containing Fluorinated Alkoxy Side Chains, Journal of Polymer Science: Part A: Polymer Chemistry, 1990, vol. 28, pp. 323-331.

* cited by examiner

THERMALLY SWITCHABLE DIELECTRICS

CROSS-REFERENCE TO RELATED APPLICATION

This application claims the benefit of U.S. Provisional Application No. 61/311,890, filed Mar. 9, 2010, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to dielectric materials and, in particular, to thermally switchable dielectrics that can be used in capacitors that fail when heated due to a non-conjugated precursor polymer irreversibly switching from an insulator to an electrically conductive conjugated polymer at a specific elevated temperature.

BACKGROUND OF THE INVENTION

Capacitors that have a built in safety mechanism may be useful for a variety of applications, such as for hybrid and all electric vehicles. In the event of a crash of such a vehicle, a charged capacitor may represent a significant electrical hazard to first responders as a typical capacitor bank uses 1000 mF of capacitance at a voltage of up to 2000 V. No current capacitor technology exists to drain the capacitor charge in a controlled way in the event of a crash.

Due to their electronic and optoelectronic properties, conjugated polymers, such as poly(p-phenylenevinylene) (PPV), are widely used in photovoltaics, organic light emitting diodes, and organic transistors. See C. Li et al., *Chem. Rev.* 110, 6817 (2010); A. C. Grimsdale et al., *Chem. Rev.* 109, 897 (2009), and L.-L. Chua et al., *Nature* 434, 194 (2005). Conjugated polymers, including PPV, tend to be highly insoluble in common solvents, which is a limiting factor for processing these materials into devices. One strategy to overcome the limited solubility of PPV is to create a non-conjugated soluble precursor polymer that can be integrated into a device; the material is then heated to high temperatures eliminating the leaving groups and conjugating the polymer backbone (forming PPV). While precursor routes have enabled the processing of highly insoluble precursor polymers, the associated electronic change in a polymer going from a non-conjugated to a conjugated state has never been utilized for an application.

The present invention uses the temperature-induced conjugation of a precursor polymer as a means to disable a capacitor.

SUMMARY OF THE INVENTION

The present invention is directed to a thermally switchable dielectric comprising a non-conjugated precursor polymer having a leaving group that eliminates upon heating to a specific elevated temperature, thereby converting the non-conjugated precursor polymer from an insulator to an electrically conductive conjugated polymer. The non-conjugated precursor polymer can comprise a precursor of poly(phenylene vinylene), poly(thiophene vinylene), poly(aniline vinylene), or poly(pyrrole vinylene), or copolymers thereof. The leaving group can comprise halogen, alkoxy, cyano, nitro, xanthate, sulfide, or ester.

For example, the non-conjugated precursor polymer can comprise poly[(2,3-diphenyl-p-phenylene)(2-halo-ethylene)] wherein the leaving group comprises a halogen. At high temperature, elimination of the halogen (or other leaving group) irreversibly converts the precursor to conjugated poly[(2,3-diphenyl-p-phenylene)vinylene] (DP-PPV). The temperature induced conjugation of these precursor DP-PPV polymers can be controlled by the stability of the leaving groups. For example, electrical characterization of the chloro precursor polymer, poly[(2,3-diphenyl-p-phenylene)(2-chloroethylene)], indicates the material functions as an insulator with a higher dielectric constant than commercial non-fluorinated polymer dielectrics. However, once a preset temperature is reached, conjugation of the polymer backbone causes capacitor failure. The poly[(2,3-diphenyl-p-phenylene)(2-halo-ethylene)] can further comprise at least one electron-withdrawing polar substituent on at least one of the diphenyl rings. Further, the incorporation of chlorine in the phenyl rings increases the dielectric constant by ~0.5 compared to DP-PPV while maintaining a low dissipation factor. The incorporation of fluorine in the phenyl rings increases the dielectric constant by ~1 compared to its non-fluorinated counterpart.

With a low dissipation factor and a wide range of operating temperatures (with the appropriate stability leaving group), precursor DP-PPV polymers and other non-conjugated precursor polymers are well suited for dielectric applications. Therefore, the present invention is further directed to a capacitor comprising a thermally switchable dielectric between two electrodes, wherein the dielectric fails at a specific temperature due to a non-conjugated precursor polymer irreversibly switching from an insulator to an electrically conductive conjugated polymer. Because the conjugation temperature can be altered by the choice of leaving group, specific 'set' temperatures can be chosen for capacitor failure. For example, the specific temperature can be between about 90° C. and 250° C., depending on the specific leaving group substituent used. By employing thermo-converting capacitor dielectrics in electronics, capacitors can be converted to a bleed resistor and effectively shut down in the event of a fire or overheating, providing a fundamental safety mechanism in electronic devices.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 4A shows the dielectric constant and FIG. 4B shows the dissipation factor at varying frequencies. FIG. 4C shows the capacitance and FIG. 4D shows the dissipation factor as a function of temperature.

DETAILED DESCRIPTION OF THE INVENTION

Conducting polymers have attracted attention in many areas of materials chemistry due to their tunability and wide range of applications. See R. H. Friend et al., *Nature* 397, 121 (1999); and Y.-J. Cheng et al., *Chem. Rev.* 109, 5868 (2009). For example, poly(p-phenylene vinylenes) (PPV's) are a class of conjugated polymers with applications ranging from light emitting diodes to photovoltaics. To overcome the limited solubility of many PPV polymers, films are cast from the soluble precursor polymers and thermal treatment of the films then converts the material into its final conjugated state. The present invention uses the thermo-switchable properties of precursor PPV-type polymers and other types of non-conjugated precursor polymers to provide capacitor dielectrics that will fail at specific temperatures due to the non-conjugated precursor polymer irreversibly switching from an insulator to a conducting conjugated polymer. By utilizing different leaving groups on the polymer main chain, the temperature at which the polymer transforms into a conductor can be varied over a range of temperatures. As described below, electrical characterization of thin-film capacitors prepared from several precursor PPV polymers indicates that these materials have good dielectric properties until they reach elevated temperatures, at which point conjugation of the polymer backbone effectively disables the device. Other precursor polymers can also be used with the thermally switchable capacitor of the present invention, including but not limited to precursors of poly(thiophene vinylene), poly(aniline vinylene), and poly (pyrrole vinylene). The non-conjugated precursor polymer can comprise different leaving groups, including but not limited to halogen, alkoxy, cyano, nitro, xanthate, sulfide, or ester groups.

Figure 1:
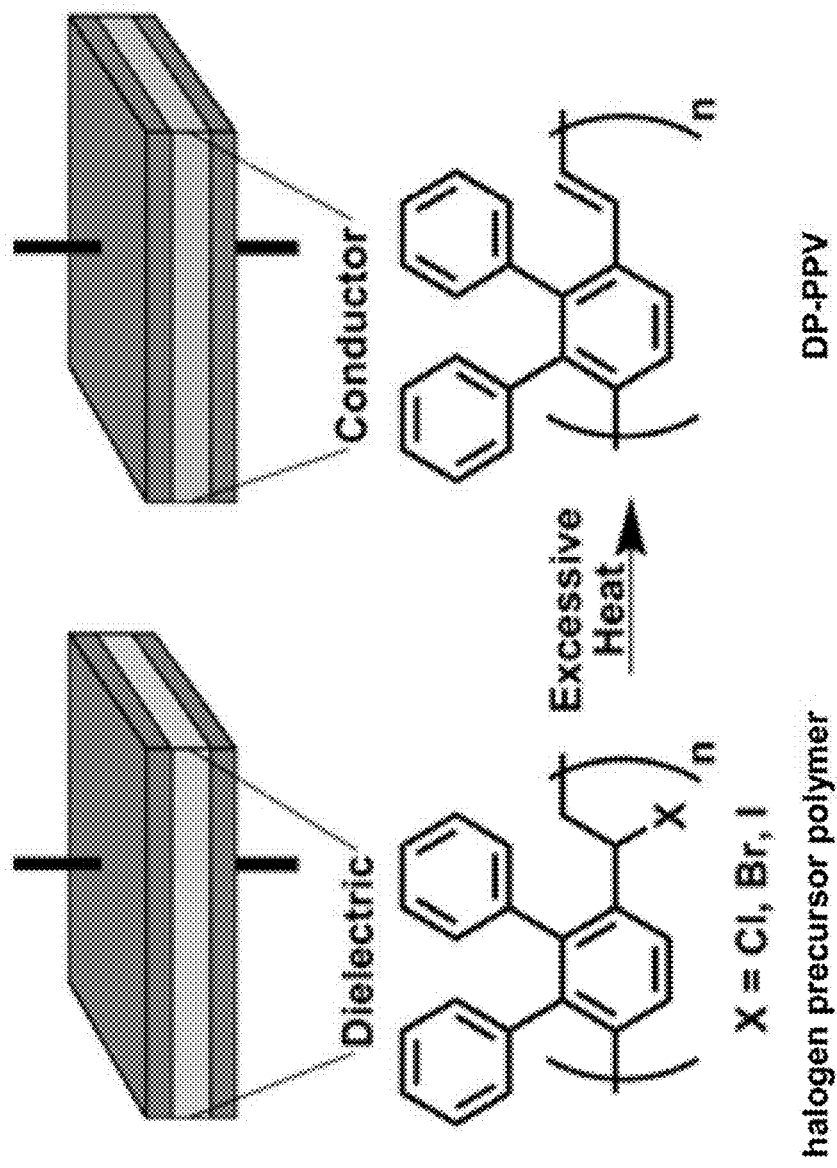
FIG. 1 is a schematic illustration of how a halogen precursor polymer functions as a dielectric until excessive temperatures eliminate the halide converting the halogen precursor polymer into a conjugated DP-PPV polymer, thereby preventing capacitor charging.

FIG. 1 shows an example of the present invention that uses a precursor PPV-type polymer as a dielectric material that can fail as a short by conjugating at specific temperatures. By employing a capacitor dielectric that can convert to a conductive state, the build-up and discharge of electricity in the event of a fire or overheating can be averted, providing a fundamental safety mechanism for high-voltage electrical devices. In particular, the high dipole density of a halogen precursor polymer to poly[(2,3-diphenyl-p-phenylene)vinylene] (DP-PPV) allows the material to function as a good dielectric. At high temperatures, however, elimination of the halogen (or other leaving group) irreversibly converts the polymer to a conjugated state. See B. R. Hsieh et al., *Adv. Mater.* 7, 36 (1995); W. C. Wan et al., *Macromolecules* 30, 6567 (1997); B. R. Hsieh et al., *J. Am. Chem. Soc.* 120, 231 (1998); and B. R. Hsieh et al., *Macromolecules* 31, 631 (1998). After conjugation, the delocalized π-system of the polymer backbone is sufficiently conductive to short out the capacitor.

Precursor Poly[(2,3-diphenyl-p-phenylene)vinylene] (DP-PPV) Polymers

Figure 2:
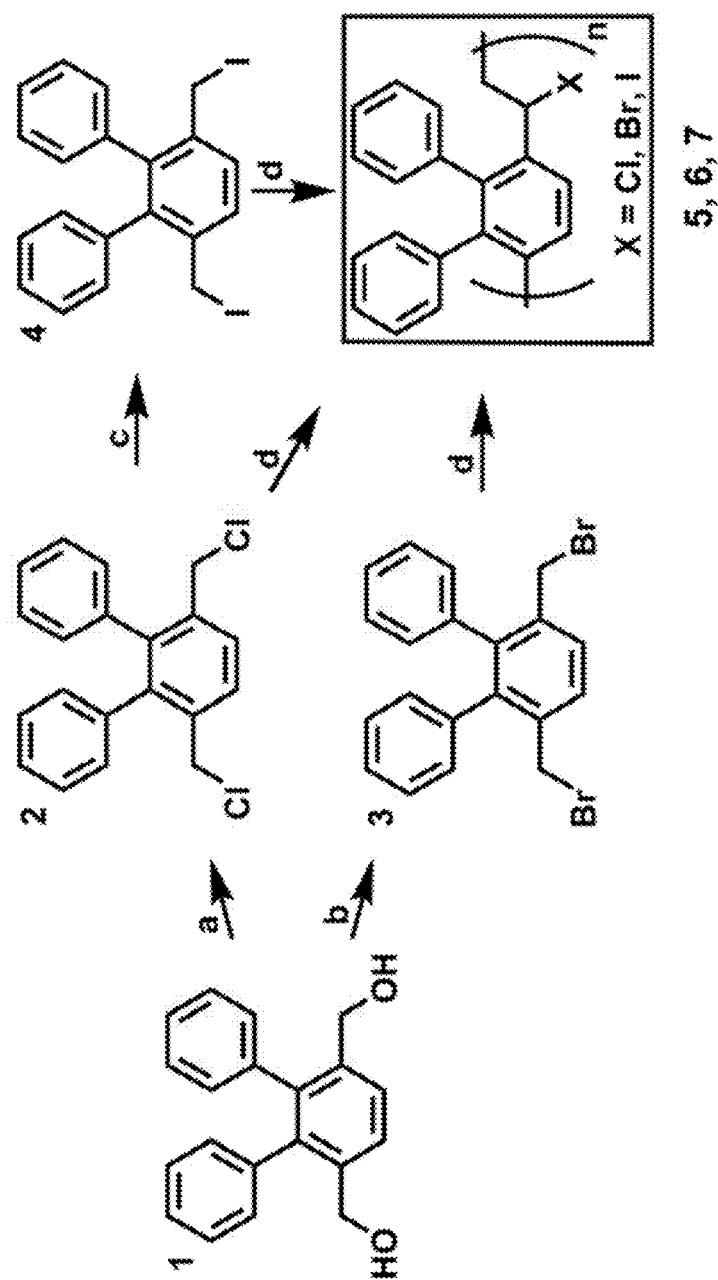
FIG. 2 shows the synthesis of halogen precursor polymers from halogen monomers, starting with a diol intermediate.

DP-PPV precursor polymers can use different leaving groups to effectively thermo-switch the polymers to a conjugated state over a range of temperatures. FIG. 2 shows the synthesis of halogen precursor polymers that were used as examples of the present invention. Hsieh and coworkers have previously reported the synthesis and electroluminescent properties of DP-PPV converted from a chloro precursor polymer. See B. R. Hsieh et al., *Adv. Mater.* 7, 36 (1995); and W. C. Wan et al., *Macromolecules* 30, 6567 (1997). Synthesis of intermediates 1, the chloro monomer 2, and the chloro precursor polymer 5 are based on these reports.

The bromo monomer 3 was obtained by reaction of the diol 1 with thionyl bromide. In this example, 1,4-Bis(hydroxymethyl)-2,3-diphenylbenzene 1 (2.00 g, 6.88 mmol) was stirred in thionyl bromide (4.50 mL, 58.0 mmol) at room temperature for 6 h. The solution was cooled to 0° C. and ice cold de-ionized $H_2O$ (5 mL) was added dropwise. The mixture was extracted with EtOAc and washed with de-ionized $H_2O$, $NaHSO_3$, and brine, dried over $Na_2SO_4$, and the solvent was evaporated (rotovap). Column chromatography was performed (0-5% EtOAc/Hex) to yield the desired compound 1,4-Bis(bromomethyl)-2,3-diphenylbenzene 3 ($C_{20}H_{16}Br_2$, 2.50 g, 87%) as a white solid.

The iodo monomer 4 was synthesized utilizing a Finkelstein reaction with the chloro monomer 2. In this example, to a solution of 1,4-Bis(chloromethyl)-2,3-diphenylbenzene 2 (1.10 g, 3.05 mmol) in acetone (15 mL) was added KI (2.23 g, 12.2 mmol). The reaction was brought to reflux for 5 h, allowed to cool, and the solvent was evaporated (rotovap). The residue was dissolved in EtOAc and washed with de-ionized $H_2O$ and brine, dried over $Na_2SO_4$, and the solvent was evaporated (rotovap). The product was recrystallized from EtOAc and then triturated in hexane (to remove the residual color). The desired product 1,4-Bis(iodomethyl)-2,3-diphenylbenzene 4 ($C_{20}H_{16}I_2$, 1.21 g, 78%) was obtained as a beige colored solid.

Polymerization of the three halogenated monomers 2, 3, and 4 was achieved by adding one equivalent of t-BuOK to a stirred solution of the monomer in anhydrous THF at 0° C. The reactions were allowed to warm to room temperature over a 1 h time period. The bromo and iodo polymers were isolated by precipitation with methanol followed by centrifugation, which was found to limit material losses compared to filtering. It was noted that when stored under ambient light, the bromo polymer turned a deeper shade of yellow while the iodo polymer turned orange in color. A $^1$H-NMR of the iodo polymer exposed to ambient light for 21 days indicated the halogen had eliminated (data not shown). Subsequent samples were stored in the absence of light, which was found to prevent elimination of the halogen.

In this example, poly[(2,3-diphenyl-p-phenylene)(2-chloroethylene)] 5 was synthesized as follows. To a solution of the chloro monomer 2 (4.00 g, 12.2 mmol) in anhydrous THF (100 mL) was slowly added t-BuOK (12.0 mL, 1.0 M) over a 20 min time period. The reaction was stirred for 1.25 h and poured over MeOH (500 mL). The precipitate was filtered yielding a pale yellow solid (1.65 g). The number and weight average molecular weight were determined to be 814,963 and 1,423,206 with a $M_w/M_n$ ratio of 1.74.

In this example, poly[(2,3-diphenyl-p-phenylene)(2-bromoethylene)] 6 was synthesized as follows. To a solution of bromo monomer 3 (1.26 g, 3.02 mmol) in anhydrous THF (40 mL) was slowly added t-BuOK (3.00 mL, 1.0 M) at 0° C. The tangerine colored solution was allowed to warm to room temperature and stirred for 70 min. MeOH (40 mL) was added and the mixture was centrifuged. The supernatant was decanted and the solid was dried under a stream of $N_2$ and then placed under vacuum for 4 h. The pale yellow solid (0.63 g) was protected from light and stored at 0° C. The number and weight average molecular weight were determined to be 145,584 and 373,867 with a $M_w/M_n$ ratio of 2.57.

In this example, poly[(2,3-diphenyl-p-phenylene)(2-iodoethylene)] 7 was synthesized as follows. To a solution of iodo monomer 4 (1.26 g, 2.46 mmol) in anhydrous THF (40 mL) was added t-BuOK (2.45 mL, 1.0 M) at 0° C. The reaction was allowed to warm to room temperature and stirred for 1 h. MeOH (55 mL) was added and the mixture was centrifuged. The supernatant was decanted and the solid was dried under a stream of $N_2$ and then placed under vacuum for 4 h. The light yellow solid (0.48 g) was protected from light and stored at 0° C. to prevent elimination. The number and weight average molecular weight were determined to be 37,643 and 129,006 with a $M_w/M_n$ ratio of 3.43.

Figure 3:
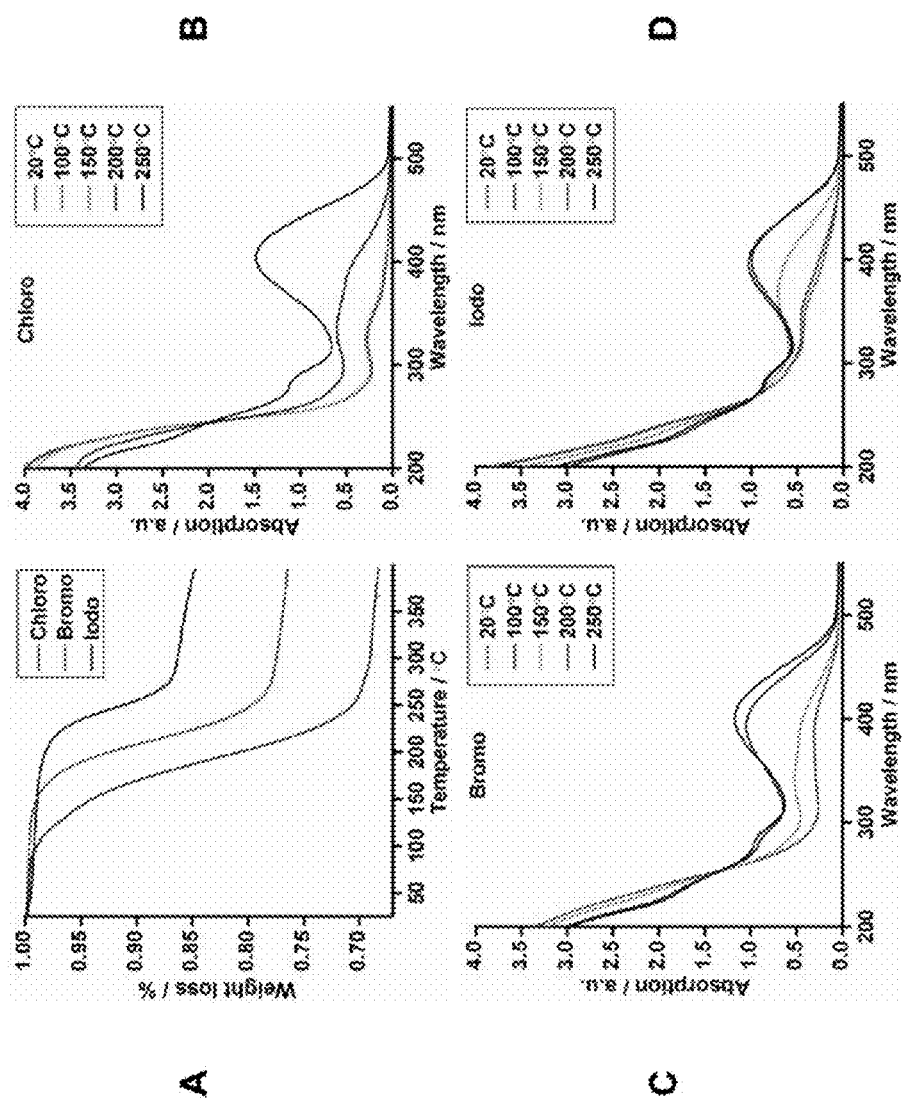
FIG. 3A shows the thermogravimetric analysis (TGA) of the halogen precursor polymers.
FIGS. 3B-D show the temperature dependent UV-Vis spectra of the chloro, bromo, and iodo precursor polymers.

As shown in FIG. 3A, thermogravimetric analysis (TGA) was performed to determine the temperatures at which the halogens eliminated. It was found that the onset of elimination occurred at 180° C. for the chloro polymer, 137° C. for the bromo polymer, and 90° C. for the iodo polymer, indicating the relative decrease in carbon-halogen bond strengths. It was estimated that the chloro polymer underwent a 12.3% mass loss (12.5% expected theoretically), the bromo polymer underwent a 21.4% mass loss (24.1% expected theoretically), and the iodo polymer underwent a 30.1% mass loss (33.5% expected theoretically), consistent with the loss of the corresponding halide (HX). The TGA results indicate the thermoconversion temperature can be modulated by utilizing different stability leaving groups.

To confirm the halogen elimination resulted in the polymers irreversible conversion to a conjugated state, UV-Vis spectroscopy was performed on the three halogen precursor polymers, as shown in FIGS. 3B-D. Solutions were prepared in chloroform (10 mg/mL) and deposited onto quartz slides. Excess sample was removed by tilting the slides to a vertical position while the sample was in contact with filter paper. The samples were air dried and UV-Vis spectra were recorded. Subsequent measurements were taken after the samples had been heated in an oven to 100, 150, 200 and 250° C. (30 min. at each temperature). The thermal ramping was conducted under an ambient atmosphere with no attempt to exclude oxygen. As the temperature was increased, a new band at ~400 nm appeared for all three polymers, a result of $\pi \rightarrow \pi^*$ transitions along the conjugated polymer backbone. See B. R. Hsieh et al., *Adv. Mater.* 7, 36 (1995); and W. C. Wan et al., *Macromolecules* 30, 6567 (1997). The absorption spectra of the chloro polymer changed after the sample was heated to 200° C., the bromo polymer changed after heating to 150° C., and the iodo polymer began to change after 100° C., in good agreement with the TGA results.

Figure 4:
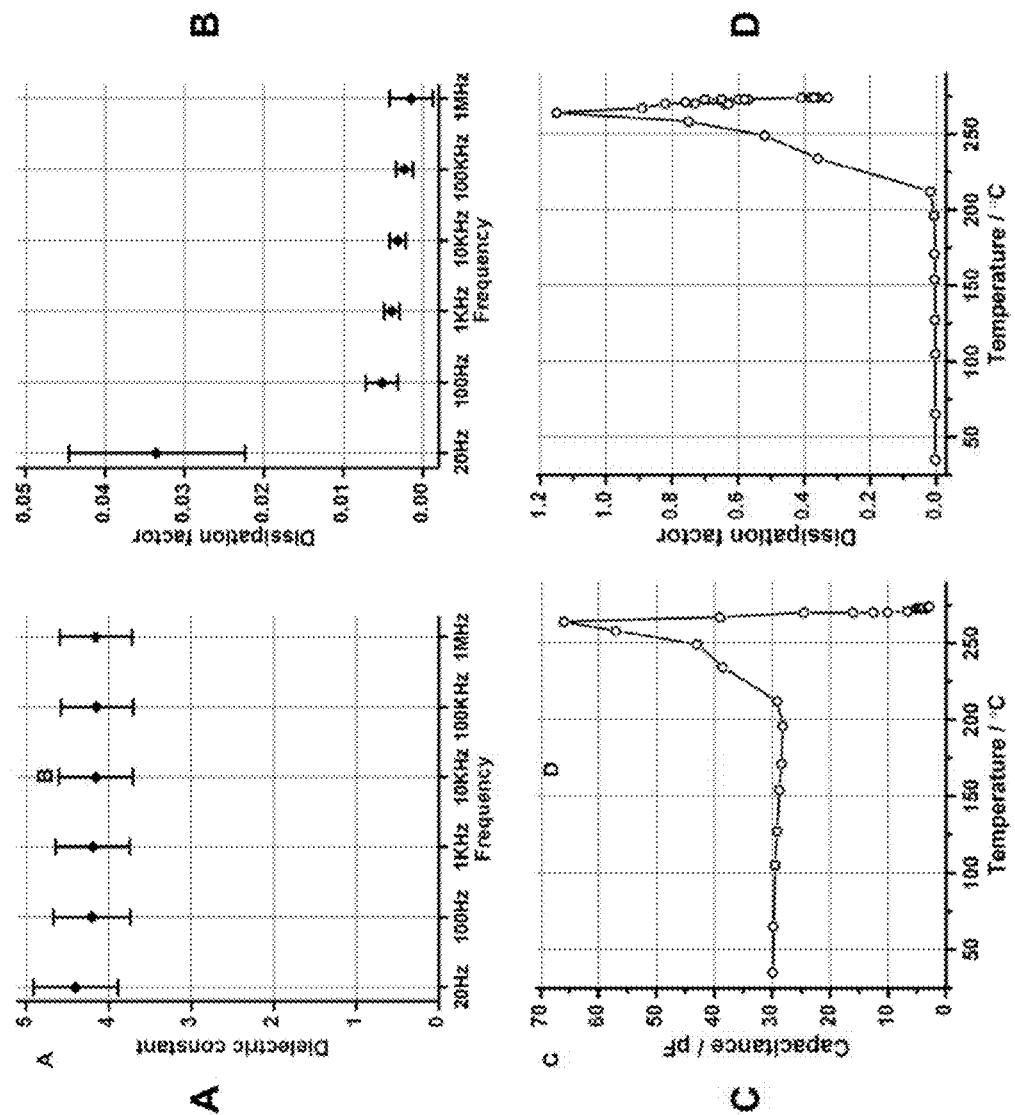
FIG. 4 shows electrical measurements of thin film capacitors made from the chloro precursor polymer.

As shown in FIG. 4, electrical measurements were performed on the chloro precursor polymer to determine the dielectric constant (K) and the dissipation factor (DF). See J. X. Lu et al., *J. Mater. Chem.* 16, 1543 (2006). Using a drawdown machine, a solution of the polymer (100 mg/mL, chloroform) was spread and allowed to air dry. Circular gold electrodes (6 mm in diameter, ~100 nm thick) were RF sputter deposited onto the polymer film using a stainless steel mask. The bottom side of the polymer film was coated with a blanket film of gold ~100 nm thick. FIGS. 4A and 4B show capacitance and DF values recorded on 6 different areas of the film at 1 volt and frequencies of 20 Hz, 100 Hz, 1 KHz, 10 KHz, 100 KHz, and 1 MHz. The average dielectric constant over the entire frequency range was calculated to be 4.2±0.4, which is significantly higher than other non-fluorinated polymer dielectrics (polypropylene 2.2, polyethylene terephthalate 2.7, polystyrene 2.5). See T. Takahagi et al., *Jpn. J. Appl. Phys.* 42, 157 (2003). The high κ value is attributed to significant polarizability in the polymer structure, and is an advantageous feature for dielectric materials because the capacitor dimensions can be minimized. The material also possessed a low DF that decreased slightly with frequency, indicating the polymer stores charge well.

A variable temperature experiment was performed on a metalized thin film of the chloro polymer to assess the material's performance as a capacitor at elevated temperatures. The edges of the polymer film were taped (with Kapton®) to a thin piece of copper to prevent the film from curling at high temperatures. Measurements were taken at 10 volts and a frequency of 1 KHz. As shown in FIGS. 4C and 4D, neither capacitance nor DF significantly changed until the temperature reached ~200° C., above which, the values significantly increased and then decreased. As the TGA and UV-Vis studies indicate, the chloro polymer begins to conjugate at ~200° C., the sudden increase in capacitance and DF at the same temperature is attributed to the conjugation process. The polymer film underwent an irreversible color change from light yellow to dark orange as the temperature exceeded ~225° C. The sudden increase in capacitance and DF can be attributed to two major factors: first, conjugation creates a new path for electron flow through the delocalized π-system of the polymer backbone, causing an increase in the conductivity and polarizability of the material. Additionally, HCl (a small polarizable molecule with a dipole moment of 1.109 debye) is released during conjugation; doping of conjugated polymers with strong acids is known to cause a large increase in conductivity. See M. Seth et al., *Mol. Phys.* 96, 1767 (1999); T. Ohnishi et al., *Synth. Met.* 41-43, 309 (1991); J. I. Jin et al., *Macromolecules* 26, 1799 (1993); M. Esteghamatian and G. Xu, *Synth. Met.* 63, 195 (1994); and M. Ahlskog et al., *Synth. Met.* 89, 11 (1997). However, at high temperatures, HCl would quickly be driven from the sample, consistent with the subsequently observed decrease in capacitance and DF. XPS analysis performed on a non-metalized area of the thermally treated film showed 0.3% chlorine content, indicating a near complete elimination and ejection of HCl from the surface of the polymer.

Although the capacitance of the material initially increased, the corresponding spike in dissipation factor is a better indication that the polymer was no longer holding charge (i.e., failing). As HCl evolved from the sample, the capacitance dropped to 9% of the initial room temperature value, followed by an additional 3% decrease as the material cooled to room temperature (data not shown), indicating an extremely limited ability of the polymer to store charge after the thermo-conversion. Likewise, after the initial spike, the dissipation factor remained at ~0.3, representing a 75-fold increase over the room temperature value. These results clearly demonstrate irreversible capacitor failure.

DP-PPV Precursors Comprising Halogen Substituents on the Diphenyl Rings

As described above, halogen precursor polymers to poly[(2,3-diphenyl-p-phenylene)vinylene] (DP-PPV) and other non-conjugated precursor polymers can be utilized as advanced capacitor dielectrics. Below are described DP-PPV precursors comprising halogen substitutents on the diphenyl rings that also have good dielectric properties until they reach their thermo-conversion temperature. The halogen substituent can occupy any position (i.e., ortho, meta, or para) on the diphenyl rings. Due to the high electronegativity of the halogen substituent, electron density should be withdrawn from the phenyl substituents and to a lesser extent the PPV core. Also, introducing a permanent dipole moment into the polymer structure can result in an increase in the dielectric constant, which can be advantageous for minimizing capacitor dimensions. See T. Ichino et al., *J. Polym. Sci. A* 28, 323 (1990); G. Hougham et al., *Macromolecules* 27, 3642 (1994); and G. Hougham et al., *Macromolecules* 27, 5964 (1994). In addition to halogens, other polar groups can be used as electron-withdrawing substitutents on the phenyl rings.

Chlorophenol-Substituted Precursor Polymer

Figure 5:
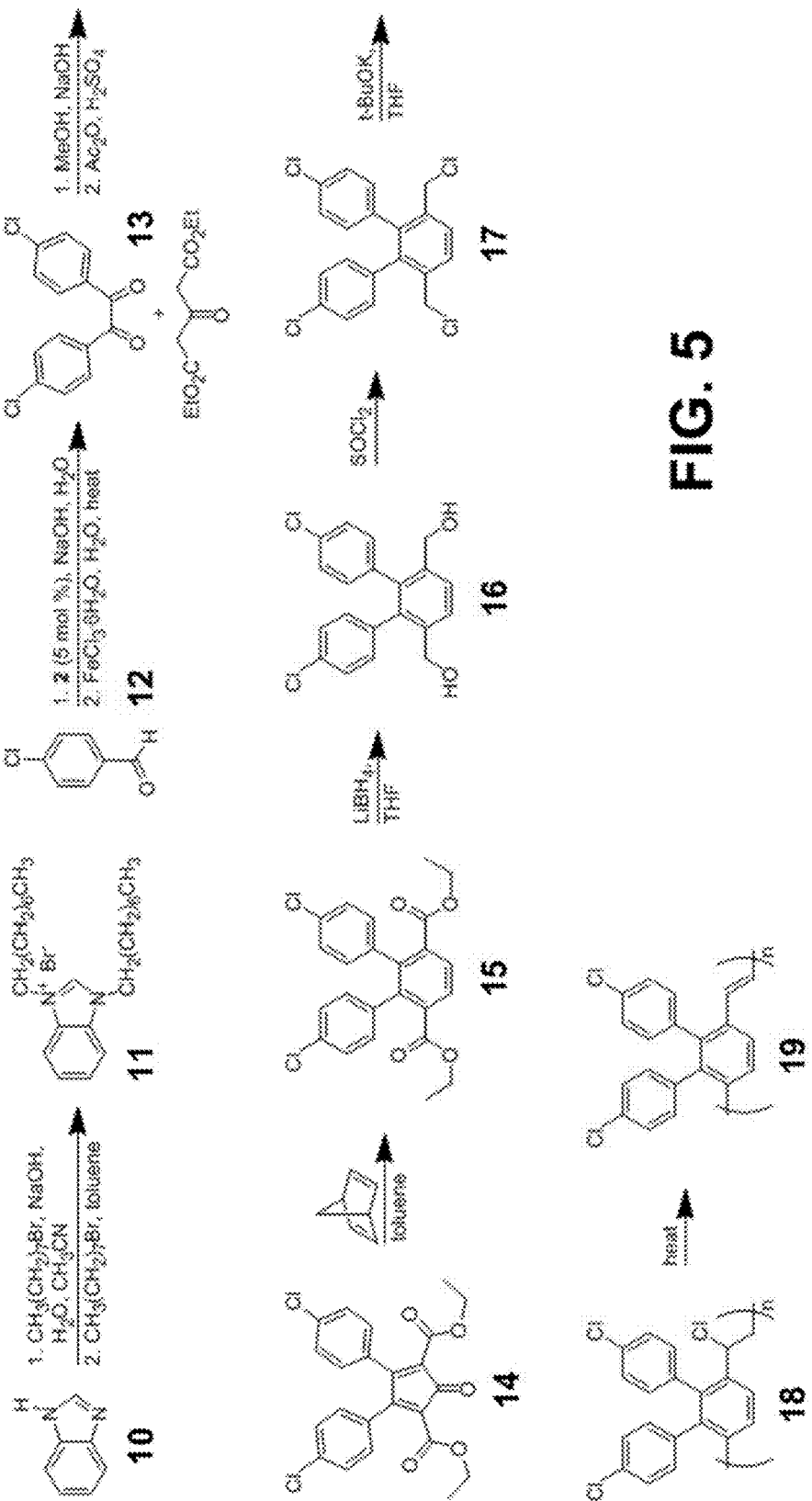
FIG. 5 shows the synthesis of a chlorophenyl-substituted precursor polymer.

FIG. 5 shows the synthetic route for the chlorophenyl-substituted precursor polymer (Cl-DP-PPV) 19. See H. V. Huynh et al., *Organometallics* 27, 2231 (2008); X. Jing et al., *Synth. Commun.* 39, 492 (2009); and W. C. Wan et al., *Macromolecules* 30, 6567 (1997). As an example, commercially available benzimidazole 10 was reacted with two equivalents of octyl bromide to produce the benzimidazolium salt 11 in 46% yield, which was used as a condensation catalyst in the following reaction. Coupling 4-chlorobenzaldehyde 12 in the presence of the condensation catalyst 11 under basic aqueous conditions followed by oxidation with iron trichloride produced 4,4'-dichlorobenzil 13 in 69% yield. The benzil derivative 13 was then condensed with diethyl 1,3-acetonedicarboxylate to afford the cyclopentanone derivative 14 in 64% yield. A Diels-Alder reaction with norbornadiene produced the terephthalate derivative 15 in 89% yield. Reduction of hindered diesters is typically carried out using $LiAlH_4$; however, a complex mixture of products was obtained as a result of the partial reduction of the phenyl chlorines. Better results were obtained with $LiBH_4$, which produced the desired diol 16 in 93% yield, but required long (36 h) reaction times. The monomer 17 was obtained in 95% yield after stirring the diol 16 in thionyl chloride for 16 h. The chlorophenyl-substituted precursor polymer 18 was afforded in 37% yield by reaction of the monomer 17 with 1 equivalent of t-BuOK. The fully conjugated polymer 19 can be prepared by heating the precursor polymer to high temperatures.

Figure 6:
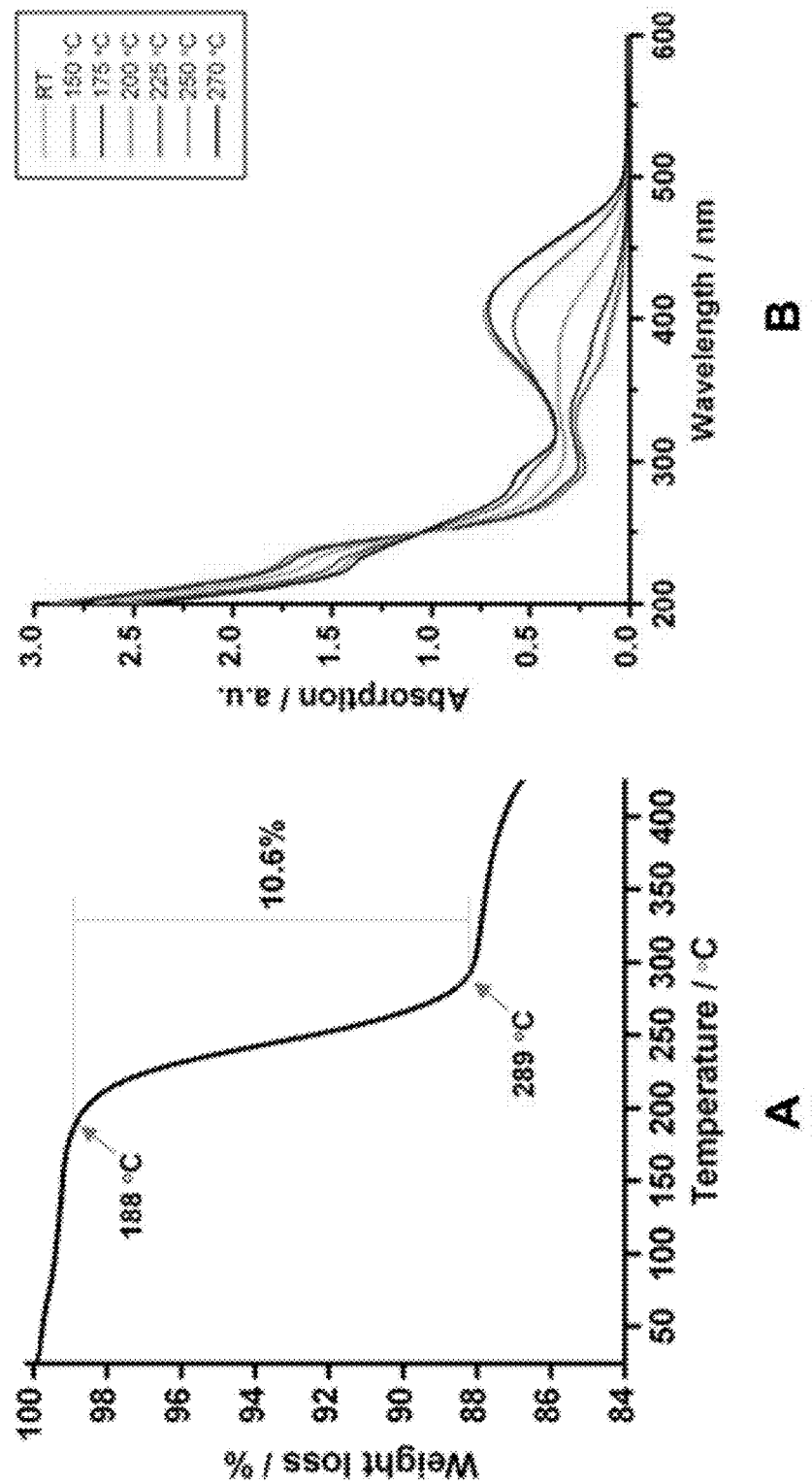
FIG. 6A shows TGA and FIG. 6B shows UV-Vis spectra of the chlorophenyl-substituted precursor polymer.

As shown in FIG. 6A, TGA was performed to determine the temperature at which the Cl-DP-PPV conjugated by eliminating HCl. TGA showed a 10.6% weight loss (10.2% theoretically) from 188-289° C., indicating the thermo-conversion temperature profile. As shown in FIG. 6B, UV-Vis spectroscopy was performed to further investigate the thermo-conversion process of the Cl-DP-PPV. A solution of the precursor polymer (1.0 mg/mL in $CHCl_3$) was drop-cast onto a quartz slide, the sample was air dried, and the spectrum was recorded. Subsequent measurements were performed after the sample was heated in an oven (measurements were taken at ~25° C. increments from 125-270° C.; the sample was subjected to 30 min at each temperature). The UV-Vis profile began displaying minor changes after the sample was subjected to 175° C. and 200° C. A new, distinct band appeared after treatment at 225° C., which continued to grow in intensity and red shift as the temperature was increased. The $\lambda_{max}$ of the band was 406 nm, and is associated with $\pi \rightarrow \pi^*$ transitions along the conjugated polymer backbone. The UV-Vis experiments support the TGA results and demonstrate the polymer undergoes an irreversible conversion from a non-conjugated to a conjugated polymer at high temperatures.

Figure 7:
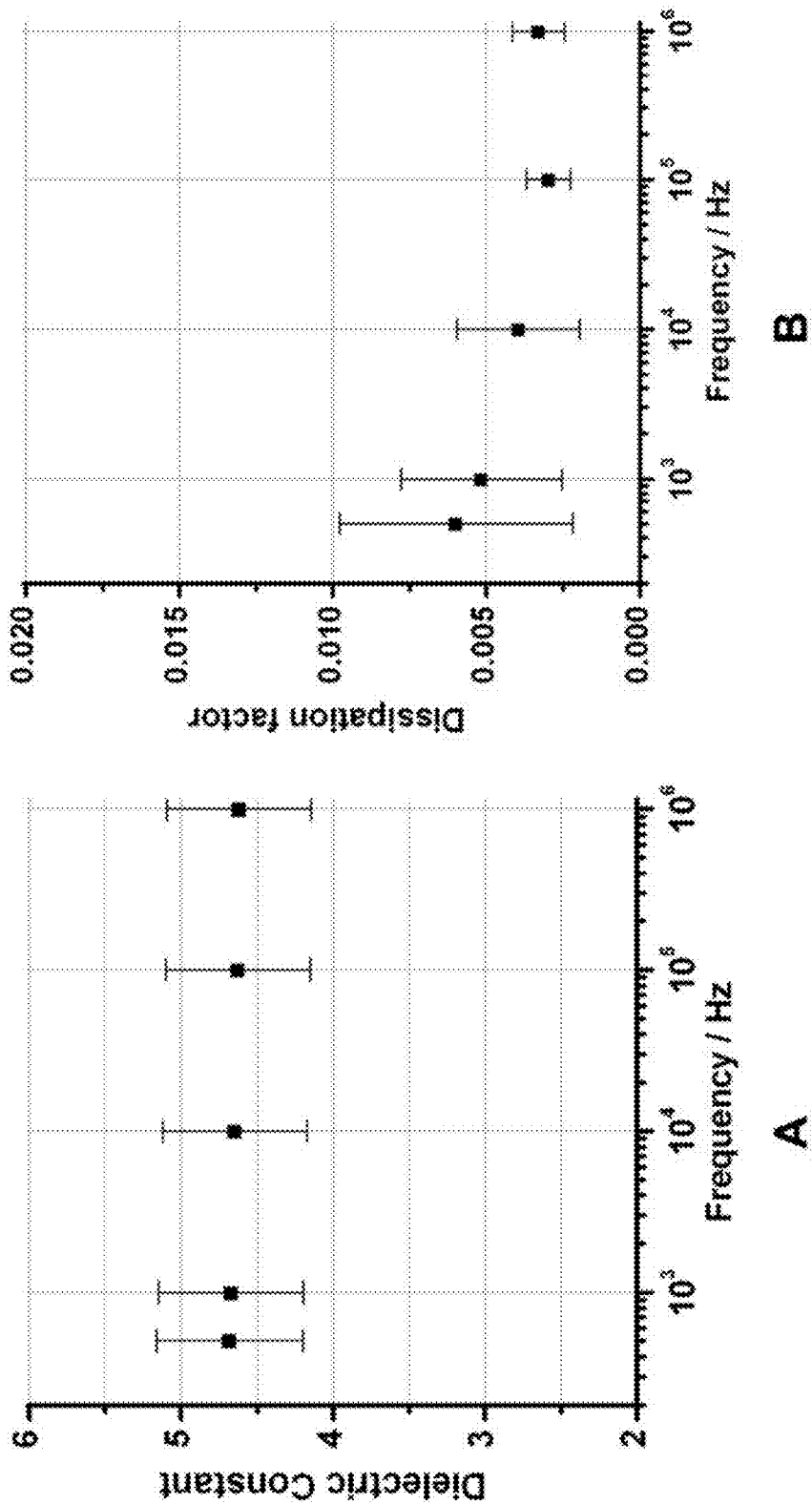
FIG. 7A shows the dielectric constant and FIG. 7B shows the dissipation factor as a function of frequency for thin-film capacitors prepared from the chlorophenyl-substituted precursor polymer.

Electrical characterization was performed on the Cl-DP-PPV to determine the material's performance as a dielectric. A viscous solution of the polymer (305 mg in 4.50 mL $CHCl_3$) was filtered through a cotton plug, and a 22 μm thick film was prepared using a drawdown machine. Using a sputter coater and a mask, circular gold electrodes (6.30 mm in diameter, ~50 mm thick) were deposited on one side of the film; the other side was blanket coated with gold (~50 nm thick). As shown in FIGS. 7A and 7B, capacitance and dissipation factor were recorded on 17 electrodes at frequencies of 500 Hz, 1 KHz, 10 KHz, 100 KHz, and 1 MHz using an LCR meter. The material displayed a low dissipation factor averaging 0.004 over the entire frequency range, indicating that the polymer stores charge very efficiently. The average dielectric constant over the entire frequency range was 4.7, which is notably higher than DP-PPV polymer (4.2) described above. The increase in dielectric constant is attributed to the additional carbon-chlorine dipoles (1.25 D) as well as the induced dipole orientation polarization from the electronegative chlorine atoms, which are anticipated to create permanent dipoles in both phenyl rings. See B. A. Hess and R. J. Buenker, *Chem. Phys.* 101, 211 (1986); and G. Hougham et al., *Macromolecules* 27, 5964 (1994).

Figure 8:
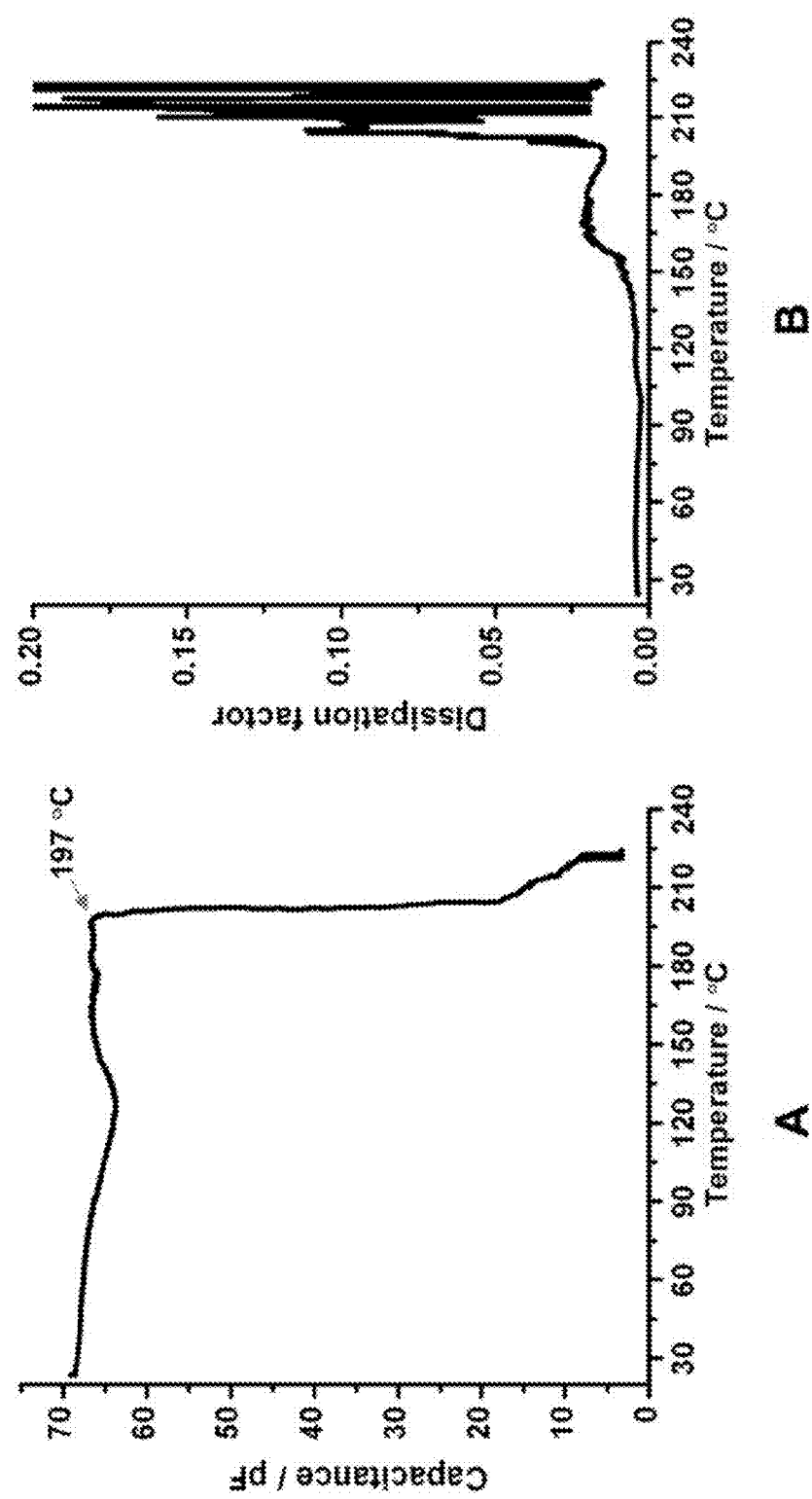
FIG. 8A shows capacitance and FIG. 8B shows the dissipation factor as a function of temperature for thin-film capacitors prepared from the chlorophenyl-substituted precursor polymer.

Variable temperature electrical characterization of the Cl-DP-PPV was performed to determine whether the thin-film capacitors would fail as the polymer conjugated. Single electrodes were heated on a hot chuck and capacitance and dissipation factor were recorded as a function of temperature, as shown in FIGS. 8A and 8B. To prevent the polymer from curling as the temperature was increased, the sample was taped down with Kapton® adhesive tape at the edges of the film. It was found that neither capacitance nor dissipation factor appreciably changed until the temperature reached ~200° C. (the same temperature at which the polymer was observed to conjugate by TGA and UV-Vis). As the temperature continued to increase, the capacitance fell to 9% of the initial value and the dissipation factor spiked, increasing approximately 23 times. This data clearly demonstrates a massive reduction in the ability of the capacitor to store charge after the thermo-conversion process.

Fluorophenyl-Substituted Precursor Polymer

Figure 9:
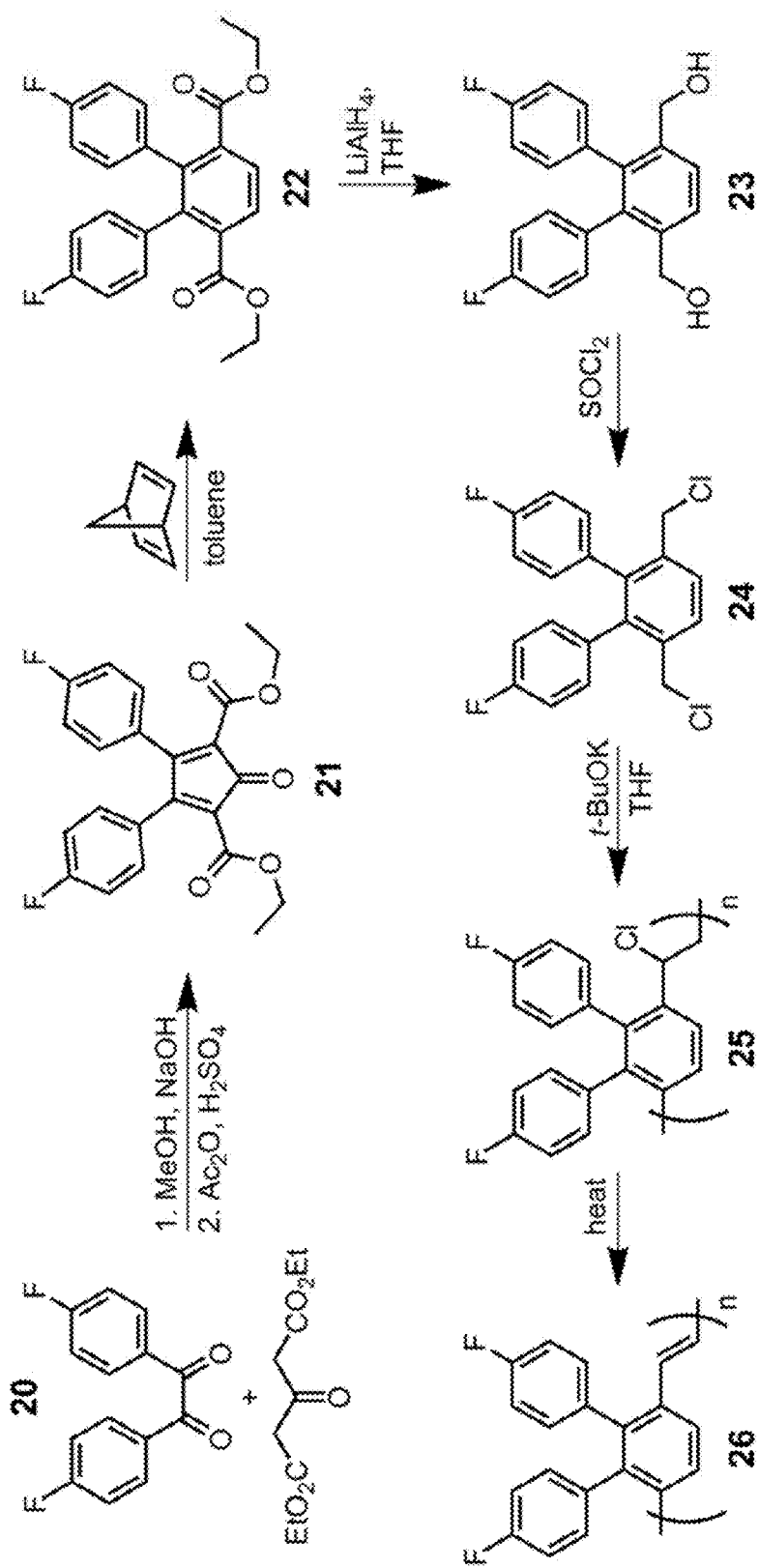
FIG. 9 shows synthesis of a fluorophenyl-substituted precursor polymer.

FIG. 9 shows the synthetic route for the fluorophenyl-substituted precursor polymer (F-DP-PPV) 26. See W. C. Wan et al., *Macromolecules* 30, 6567 (1997). A condensation reaction with 4,4'-difluorobenzil 20 and diethyl 1,3-acetonedicarboxylate afforded the cyclopentanone derivative 21 in 81% yield. A Diels-Alder reaction was carried out with norbornadiene to produce the terephthalate derivative 22 in 90% yield. The diester was reduced by refluxing in $LiAlH_4$ for 7 h, affording the diol 23 in 81% yield. The monomer 24 was obtained in quantitative yield after stirring 23 in thionyl chloride for 16 h. Polymerization was achieved by adding 1 equivalent of t-BuOK to a stirred solution of the monomer, producing the fluorophenyl-substituted precursor polymer 25 as a pale yellow solid in good yield. The conjugated polymer 26 could be obtained after heating the precursor polymer 25 to high temperatures.

Figure 10:
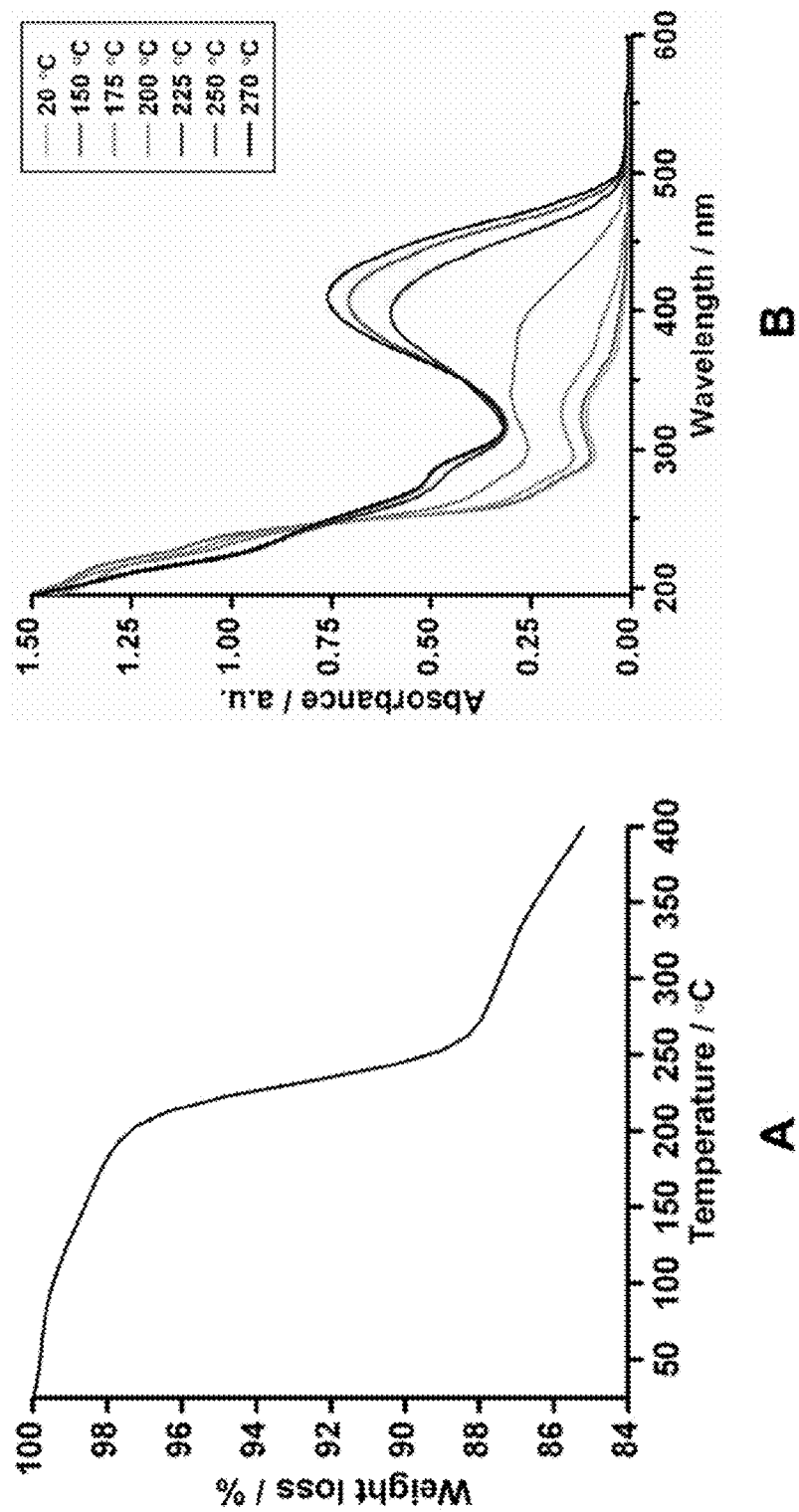
FIG. 10A shows TGA and FIG. 10B shows UV-Vis spectra of the fluorophenyl-substituted precursor polymer.

FIG. 10A shows TGA that was performed to determine the temperature at which the F-DP-PPV eliminated HCl. TGA showed a 10% weight loss (11% theoretically) from 181-272° C., indicating the thermo-conversion temperature profile. FIG. 10B shows UV-Vis spectroscopy of the F-DP-PPV as a function of temperature. A solution of the precursor polymer (5.0 mg/mL in $CHCl_3$) was drop-cast onto a quartz slide, air dried, and the spectrum was recorded. Subsequent measurements were performed after the sample was heated in an oven (measurements were taken at 25° C. increments from 75-275° C.; the sample was subjected to 20 min at each temperature). The UV-Vis profile began displaying minor changes after the sample was subjected to 150 and 175° C., but changed dramatically after the 200 and 225° C. treatments. A new band centered at 398 nm appeared after the 225° C. treatment, which was assigned to $\pi \rightarrow \pi^*$ transitions along the conjugated polymer backbone. See W. C. Wan et al., *Macromolecules* 30, 6567 (1997). As the sample was heated to 275° C., the peak increased in intensity and also red-shifted 12 nm, indicating increased conjugation along the polymer backbone. The UV-Vis experiments support the TGA results and demonstrate the polymer undergoes an irreversible conversion from a non-conjugated to a conjugated state at temperatures greater then ~200° C.

Figure 11:
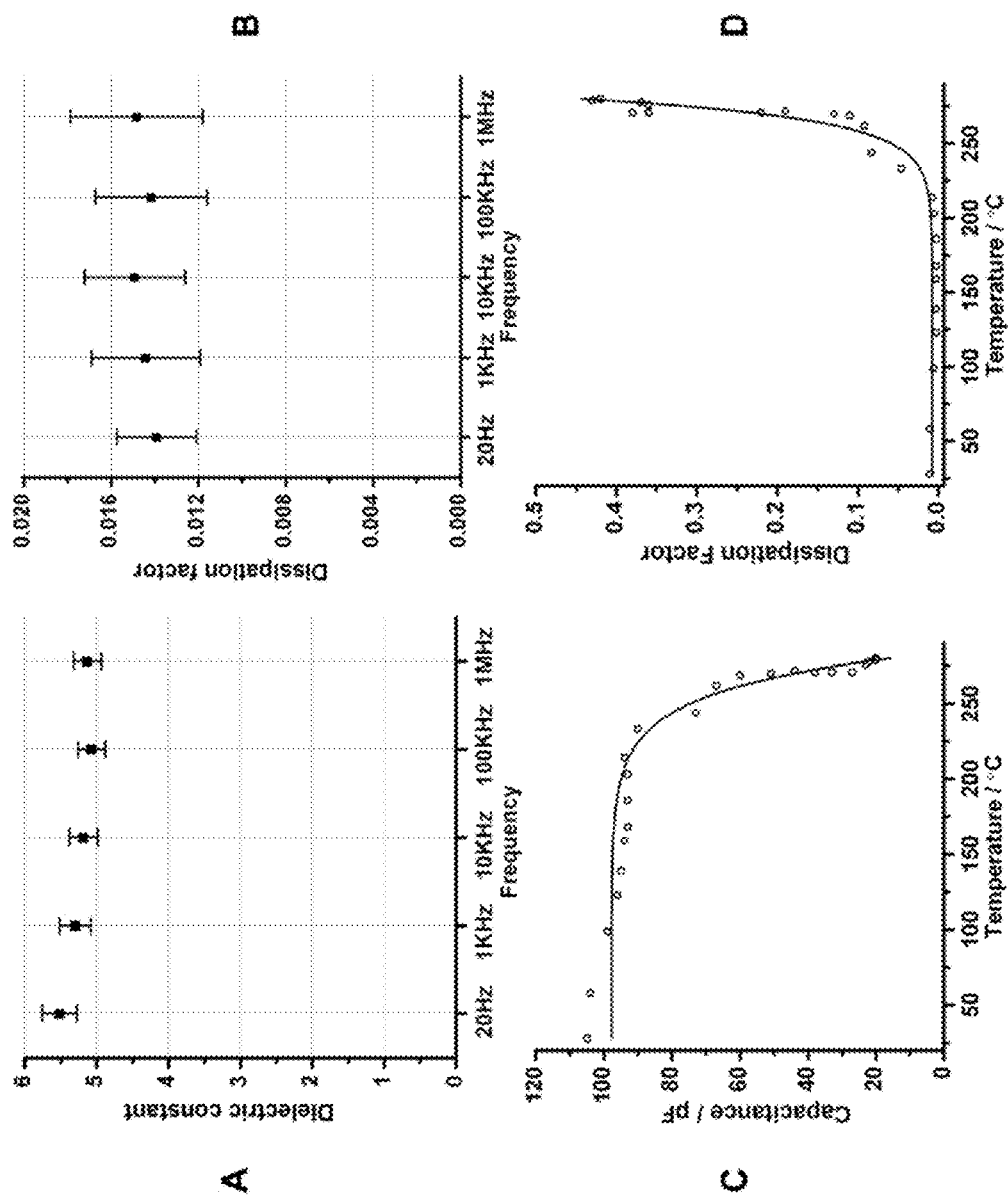
FIG. 11A shows the dielectric constant and FIG. 11B shows the dissipation factor as a function of frequency for the fluorophenyl-substituted precursor polymer.
FIG. 11C shows the capacitance and FIG. 11D shows the dissipation factor as a function of temperature (measured at 10 KHz).

Electrical characterization of the F-DP-PPV was performed to determine the material's performance as a capacitor dielectric. A film was prepared by spreading a viscous solution (100 mg in 3.75 mL dichloroethane) of the polymer on a drawdown machine. The average thickness of the film was 12.5 μm. One side of the film was coated with a blanket of gold ~75 nm thick while the opposite side was coated with circular gold electrodes (6.30 mm in diameter, ~75 mm thick). FIGS. 11A and 11B show capacitance and dissipation factor were recorded on 12 electrodes at frequencies of 20 Hz, 1 KHz, 10 KHz, 100 KHz, and 1 MHz using an LCR meter. The material displayed a low dissipation factor averaging 0.014±0.002 over the entire frequency range, indicating the polymer stores charge well. The average dielectric constant over the entire frequency range was calculated to be 5.25±0.25, which is notably higher than the above described non-fluorinated chloro precursor DP-PPV polymer (4.2±0.4). The increase in dielectric constant is attributed to dipole orientation polarization as the electronegative fluorine atoms are expected induce permanent dipoles in both phenyl rings and to a lesser extent the benzene core. See T. Ichino et al., *J. Polym. Sci. A* 28, 323 (1990); G. Hougham et al., *Macromolecules* 27, 3642 (1994); and G. Hougham et al., *Macromolecules* 27, 5964 (1994).

Variable temperature electrical testing was performed to determine whether the thin-film capacitors would fail as the polymer conjugated. Single electrodes were heated on a hot plate and capacitance and dissipation factor were recorded as a function of temperature. To prevent the polymer from curling as the temperature was increased, the sample was taped down with Kapton® tape at the edges of the film. As shown in FIGS. 11C and 11D, neither capacitance nor dissipation factor appreciably changed until the temperature reached ~215° C. (the same temperature at which the polymer was observed to conjugate by TGA and UV-Vis). As the temperature continued to increase, the capacitance fell to 20% of the initial value and the dissipation factor increased approximately 40×, indicating capacitor failure.

The present invention has been described as thermally switchable dielectrics. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A thermally switchable dielectric comprising a non-conjugated precursor polymer having a leaving group that eliminates upon heating to a specified temperature, thereby converting the non-conjugated precursor polymer from an insulator to an electrically conductive conjugated polymer, wherein the leaving group comprises a halogen.

2. A thermally switchable dielectric comprising a non-conjugated precursor polymer having a leaving group that eliminates upon heating to a specified temperature, thereby converting the non-conjugated precursor polymer from an insulator to an electrically conductive conjugated polymer, wherein the non-conjugated precursor polymer comprises poly[(2,3-diphenyl-p-phenylene)(2-halo-ethylene)] and wherein the leaving group comprises a halogen.

3. The thermally switchable dielectric of claim 2, wherein the halo-comprises bromo- or iodo-.

4. The thermally switchable dielectric of claim 1, wherein the non-conjugated precursor polymer comprises a precursor to poly(phenylene vinylene), poly(poly(thiophene vinylene), poly(aniline vinylene), or poly(pyrrole vinylene).

5. The thermally switchable dielectric of claim 2, wherein the poly[(2,3-diphenyl-p-phenylene)(2-halo-ethylene)] further comprises at least one polar substituent on at least one of the diphenyl rings.

6. The thermally switchable dielectric of claim 5, wherein the at least one polar substituent comprises a halogen.

7. The thermally switchable dielectric of claim 6, wherein the halogen comprises chlorine or fluorine.

8. A capacitor comprising a thermally switchable dielectric between two electrodes that fails at a specific elevated temperature, wherein the thermally switchable dielectric comprises a non-conjugated precursor polymer having a leaving group that eliminates upon heating to the specific elevated temperature, thereby converting the non-conjugated polymer precursor from an insulator to an electrically conductive conjugated polymer, wherein the leaving group comprises a halogen.

9. A capacitor comprising a thermally switchable dielectric between two electrodes that fails at a specific elevated temperature, wherein the thermally switchable dielectric comprises a non-conjugated precursor polymer having a leaving group that eliminates upon heating to the specific elevated temperature, thereby converting the non-conjugated polymer precursor from an insulator to an electrically conductive conjugated polymer, wherein the non-conjugated precursor polymer comprises poly[(2,3-diphenyl-p-phenylene)(2-halo-ethylene)] and wherein the leaving group comprises a halogen.

10. The capacitor of claim 8, wherein the non-conjugated precursor polymer comprises a precursor to poly(phenylene vinylene), poly(thiophene vinylene), poly(aniline vinylene), or poly(pyrrole vinylene).

11. The capacitor of claim 9, wherein the poly[(2,3-diphenyl-p-phenylene)(2-halo-ethylene)] further comprises at least one polar substituent on at least one of the diphenyl rings.

12. The capacitor of claim 11, wherein the at least one polar substituent comprises a halogen.

13. A method for thermally switching a capacitor, comprising:

providing a capacitor comprising a thermally switchable dielectric between two electrodes, wherein the thermally switchable polymer comprises a non-conjugated precursor polymer having a leaving group that eliminates at a specific elevated temperature, and heating the capacitor to the specific elevated temperature wherein the dielectric fails due to the non-conjugated precursor polymer converting from an insulator to an electrically conductive conjugated polymer, wherein the non-conjugated precursor polymer comprises poly[(2,3-diphenyl-p-phenylene)(2-halo-ethylene)] and wherein the halo—comprises chloro-, bromo-, or iodo-.

14. The method of claim 13, wherein the specific elevated temperature is greater than about 90° C.

15. The method of claim 13, wherein the specific elevated temperature is greater than about 180° C.

* * * * *